US010290445B2

(12) United States Patent
Schmitz et al.

(10) Patent No.: US 10,290,445 B2
(45) Date of Patent: May 14, 2019

(54) SWITCHING DEVICE WITH DUAL CONTACT ASSEMBLY

(71) Applicant: EATON ELECTRICAL IP GMBH & CO. KG, Schoenefeld (DE)

(72) Inventors: Gerd Schmitz, Niederkassel (DE); Marcel Uedelhoven, Blankenheim (DE); Johannes Meissner, Bonn (DE); Michael Wohlang, Bornheim (DE)

(73) Assignee: EATON INTELLIGENT POWER LIMITED, Dublin (IE)

( * ) Notice: Subject to any disclaimer, the term of this patent is extended or adjusted under 35 U.S.C. 154(b) by 330 days.

(21) Appl. No.: 15/104,538

(22) PCT Filed: Dec. 9, 2014

(86) PCT No.: PCT/EP2014/077034
§ 371 (c)(1),
(2) Date: Jun. 15, 2016

(87) PCT Pub. No.: WO2015/091105
PCT Pub. Date: Jun. 25, 2015

(65) Prior Publication Data
US 2016/0322184 A1    Nov. 3, 2016

(30) Foreign Application Priority Data

Dec. 17, 2013    (DE) .................... 10 2013 114 259

(51) Int. Cl.
*H01H 33/04*    (2006.01)
*H01H 9/54*    (2006.01)
(Continued)

(52) U.S. Cl.
CPC ............ *H01H 33/04* (2013.01); *H01H 9/547* (2013.01); *H01H 9/56* (2013.01); *H01H 33/596* (2013.01);
(Continued)

(58) Field of Classification Search
CPC ..... G04F 3/06; G06F 1/325; H01H 2009/543; H01H 2009/544; H01H 1/226;
(Continued)

(56) References Cited

U.S. PATENT DOCUMENTS 3,639,808 A    2/1972    Ritzow
4,420,784 A    12/1983    Chen et al.
(Continued)

FOREIGN PATENT DOCUMENTS

CN    101283889 A    10/2008
DE    19601540 A1    11/1996
(Continued)

OTHER PUBLICATIONS

Van Gelder P et al: "Zero volt switching hybrid DC circuit breakers", Industry Applications Conference, 2000. Conference Record of the 2000 IEEE Oct. 8-12, 2000, Piscataway, NJ, USA, IEEE, vol. 5, Oct. 8, 2000 (Oct. 8, 2000), pp. 2923-2927, XP010521702.

*Primary Examiner* — Thienvu V Tran
*Assistant Examiner* — Nicolas Bellido
(74) *Attorney, Agent, or Firm* — Leydig, Voit & Mayer, Ltd.

(57) ABSTRACT

A switching device for conducting and interrupting electric currents, has a first mechanical contact assembly, a semiconductor switch, which is connected in parallel with the first mechanical contact assembly; a second mechanical contact assembly, which is connected in series with the first mechanical contact assembly; an auxiliary coil, which is galvanically isolated from the circuit of a switching drive for moving contacts of the first and second mechanical contact assemblies and is electromagnetically coupled to a coil of the switching drive in such a way that a voltage is produced in the auxiliary coil when the voltage supply of the switching drive is switched off; and switching electronics, which are
(Continued)

designed to switch the semiconductor switch on and off and which are supplied by the voltage produced in the auxiliary coil when the voltage supply of the switching drive is switched off.

8 Claims, 2 Drawing Sheets

(51) Int. Cl.
*H01H 9/56* (2006.01)
*H03K 17/567* (2006.01)
*H01H 33/59* (2006.01)
*H03K 17/0814* (2006.01)

(52) U.S. Cl.
CPC ..... *H03K 17/08148* (2013.01); *H03K 17/567* (2013.01); *H01H 9/542* (2013.01); *H01H 2009/543* (2013.01); *H01H 2009/544* (2013.01); *H03K 2217/0081* (2013.01)

(58) Field of Classification Search
CPC ....... H01H 2009/546; H01H 2300/018; H01H 2300/03; H01H 3/00; H01H 33/00; H01H 33/04; H01H 33/44; H01H 33/59; H01H 33/593; H01H 33/596; H01H 35/00; H01H 43/00; H01H 47/18; H01H 50/88; H01H 53/10; H01H 71/00; H01H 77/00; H01H 77/02; H01H 89/00; H01H 9/00; H01H 9/0271; H01H 9/30; H01H 9/54; H01H 9/541; H01H 9/542; H01H 9/547; H01H 9/56; H02H 1/0015; H02H 1/046; H02H 3/023; H02H 3/08; H02H 3/105; H02H 3/12; H02H 3/16; H02H 3/305; H02H 3/32; H02H 3/33; H02H 3/347; H02H 3/36; H02H 3/52; H02H 5/041; H02H 5/048; H02J 2003/388; H02J 2009/007; H02J 3/14; H02J 7/0024; H02J 7/044; H02J 7/045; H02J 9/005; H02J 9/04; H02J 9/06; H02J 9/061; H03K 17/567; H03K 2217/0081; H03K 2009/544; H03K 2009/564; H03K 17/00; H03K 17/945; H03K 17/96; H03K 19/0016; H05B 37/0281; Y02B 20/42; Y02B 70/16; Y02B 70/3225; Y02D 10/175; Y10T 307/453; Y10T 307/74; Y10T 307/76; Y10T 307/766; Y10T 307/826; Y10T 307/865; Y10T 307/951
USPC .......... 361/2, 3, 5, 8, 13, 87, 102, 115, 202; 307/112, 115, 116, 125, 131, 132 E, 141
See application file for complete search history.

(56) References Cited

U.S. PATENT DOCUMENTS

| | | | |
|---|---|---|---|
| 4,959,746 A | 9/1990 | Hongel | |
| 5,081,558 A * | 1/1992 | Mahler | H01H 9/542 361/13 |
| 5,650,901 A | 7/1997 | Yamamoto | |
| 6,208,531 B1 * | 3/2001 | Vinciarelli | H01F 38/14 363/21.07 |
| 6,347,024 B1 * | 2/2002 | Blain | H01F 9/542 361/13 |
| 6,643,112 B1 * | 11/2003 | Carton | H01H 9/54 218/3 |
| 7,227,280 B2 | 6/2007 | Zucker et al. | |
| 7,342,754 B2 * | 3/2008 | Fitzgerald | H01H 9/542 361/2 |
| 8,742,828 B2 * | 6/2014 | Naumann | H01H 9/542 327/419 |
| 8,902,550 B2 * | 12/2014 | Matsuo | H01H 9/542 361/13 |
| 9,337,640 B2 * | 5/2016 | Heerdt | H02H 9/042 |
| 2003/0193770 A1 | 10/2003 | Chung | |
| 2005/0195550 A1 | 9/2005 | Fitzgerald et al. | |
| 2010/0226140 A1 | 9/2010 | Mochizuki | |
| 2012/0007657 A1 | 1/2012 | Naumann et al. | |
| 2013/0154774 A1 * | 6/2013 | Bhavaraju | H01H 47/18 335/127 |
| 2013/0234761 A1 | 9/2013 | Weber et al. | |
| 2015/0179363 A1 * | 6/2015 | Wiersch | H01L 31/02021 200/51 R |

FOREIGN PATENT DOCUMENTS

| | | |
|---|---|---|
| DE | 10315982 A1 | 11/2003 |
| DE | 202009004198 U1 | 8/2010 |
| EP | 1649598 B1 | 10/2008 |
| EP | 2410551 A2 | 1/2012 |
| RU | 2020738 C1 | 9/1994 |
| RU | 112556 U1 | 1/2012 |
| WO | WO 2013127463 A1 | 9/2013 |

* cited by examiner

SWITCHING DEVICE WITH DUAL CONTACT ASSEMBLY

CROSS-REFERENCE TO RELATED APPLICATIONS

This application is a U.S. national stage application under 35 U.S.C. § 371 of International Application No. PCT/EP2014/077034, filed on Dec. 9, 2014, and claims benefit to German Patent Application No. DE 10 2013 114 259.1, filed on Dec. 17, 2013. The International Application was published in German on Jun. 25, 2015, as WO 2015/091105 A1 under PCT Article 21(2).

FIELD

The invention relates to a switching device for conducting and interrupting electrical currents and to a switchgear comprising a switching device of this type.

BACKGROUND

The established switching principle for switching and quenching higher currents in switchgears usually consists of a dual-breaking contact assembly which conducts the switching arcs arising therein over arc running rails in a stack of arc splitter plates in the form of deion chambers. In these chambers, the arcs are cooled and split into a plurality of sub-arcs, and this is linked to corresponding multiplication of the arc voltage. When the driving voltage is reached, the arc is quenched and the circuit is interrupted thereby. When switching high alternating currents, the arc quenching is usually assisted by dynamic magnetic blow-out fields, which are formed within the switchgear by suitably shaping the conductors. In order to quench direct currents, magnetic blow-out fields are usually used, however, which are generally produced by an arrangement of permanent magnets.

Unlike with the established alternating-current switchgears that have long been on the market, comparably large switchgears for interrupting low-frequency currents e.g. at 16⅔ Hz and direct currents accordingly have a greater load owing to the lower or lacking periodicity of the zero crossing of the current. The longer arc time arising therefrom ensures a higher energy content of the switching arcs in comparison with alternating-current switchgears. This leads both to contact material combusting more intensely and to a correspondingly high thermal load within the switching chamber. A thermal load of this type may reduce the insulation capacity within a switching chamber. As a result, this may reduce the electrical service life of the switchgear.

One option for reducing the load on a switchgear resulting from switching arcs is provided by what are known as hybrid switches. Known hybrid switches, such as those described in DE 103 15 982 A1, consist of a parallel circuit of an electromechanically actuatable main-switch contact assembly comprising a semiconductor switch e.g. based on a heavy-duty insulated gate bipolar transistor (IGBT). When switched on, said IGBT is high-resistance, and therefore the load current only flows via the closed mechanical contacts. During the switching-off process, the semiconductor switch is actuated such that it is low resistance for a short period of time, and therefore the arc current flowing through the mechanical switch is commutated to the semiconductor switch for a short period of time, and then said semiconductor switch is actuated again in a current-blocking manner, as a result of which the current conducted in the semiconductor is rapidly reduced to zero without any arcs. Using a hybrid assembly of this type, the effective arc time and therefore the load on the switch can be significantly reduced.

Most hybrid switches require an external power source in order to supply power and to actuate the semiconductor electronic system. This drawback is avoided by the invention described in DE 20 2009 004 198 U1. This is carried out such that the power required to operate the electronic system is drawn from the arc that develops when the mechanical switch is opened. At the same time, a power storage unit, preferably in the form of a capacitor, is charged by the arc current, and then provides the control voltage for shutting off the power semiconductor without any arcs. The switching process in a hybrid switch of this type therefore always involves a switching arc being temporarily formed between the mechanical contacts. However, the drawback of this arrangement is, on one hand, a load on the switchgear as before owing to the contacts burning away (even though this is accordingly reduced due to the significantly shortened arc time) and, on the other hand, a relatively long current load (in particular for higher currents) on the power semiconductor until reliable voltage strengthening has been achieved.

In the circuit described in US 2005/0195550 A1, the power stored in the coil of the electromagnetic drive is used to actuate the semiconductor switch. In order to open the contacts of the switchgear, the power supply to the coil of the drive is shut off. In so doing, the coil releases the energy stored thereby via a Zener diode, which is coupled to the primary side of a transformer. The electrical power flowing through the primary side generates a corresponding voltage on the secondary side of the transformer, which voltage drives a current through a resistor for limiting current and via a Zener diode connected in parallel with the secondary side, which current switches on the semiconductor switch, which is connected in parallel with the contacts of the switchgear and takes over the load current. In so doing, the semiconductor switch is switched on more rapidly than the mechanical contacts of the switchgear are opened, and therefore the load current can already commutate at the moment at which the mechanical contacts on the semiconductor switch open. As a result, a switching arc can in principle be prevented from developing between the mechanical contacts.

The problem addressed by the invention is to propose a switching device for conducting and interrupting electrical currents and a switchgear comprising a switching device of this type, which makes further improvements on the circuit known from US 2005/0195550 A1.

SUMMARY

An aspect of the invention provides a switching device for conducting and interrupting electrical currents, the device comprising: a first mechanical contact assembly; a semiconductor switch connected in parallel with the first mechanical contact assembly; a second mechanical contact assembly connected in series with the first mechanical contact assembly; an auxiliary coil which is galvanically isolated from a circuit of a contact module configured to move one or more contacts of the first and second mechanical contact assembly, the auxiliary coil being electromagnetically coupled to a coil of the contact module such that a voltage is generated therein when a power supply to the contact module is shut off; an electronic switching system which is supplied with the voltage that is generated in the auxiliary coil when the power supply to the contact module is shut off; and a current transformer configured to detect the flow of current through the semiconductor switch and generate a corresponding signal which is conveyed to the electronic switching system, the electronic switching system being configured to shut off the semiconductor switch depending on the signal conveyed.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
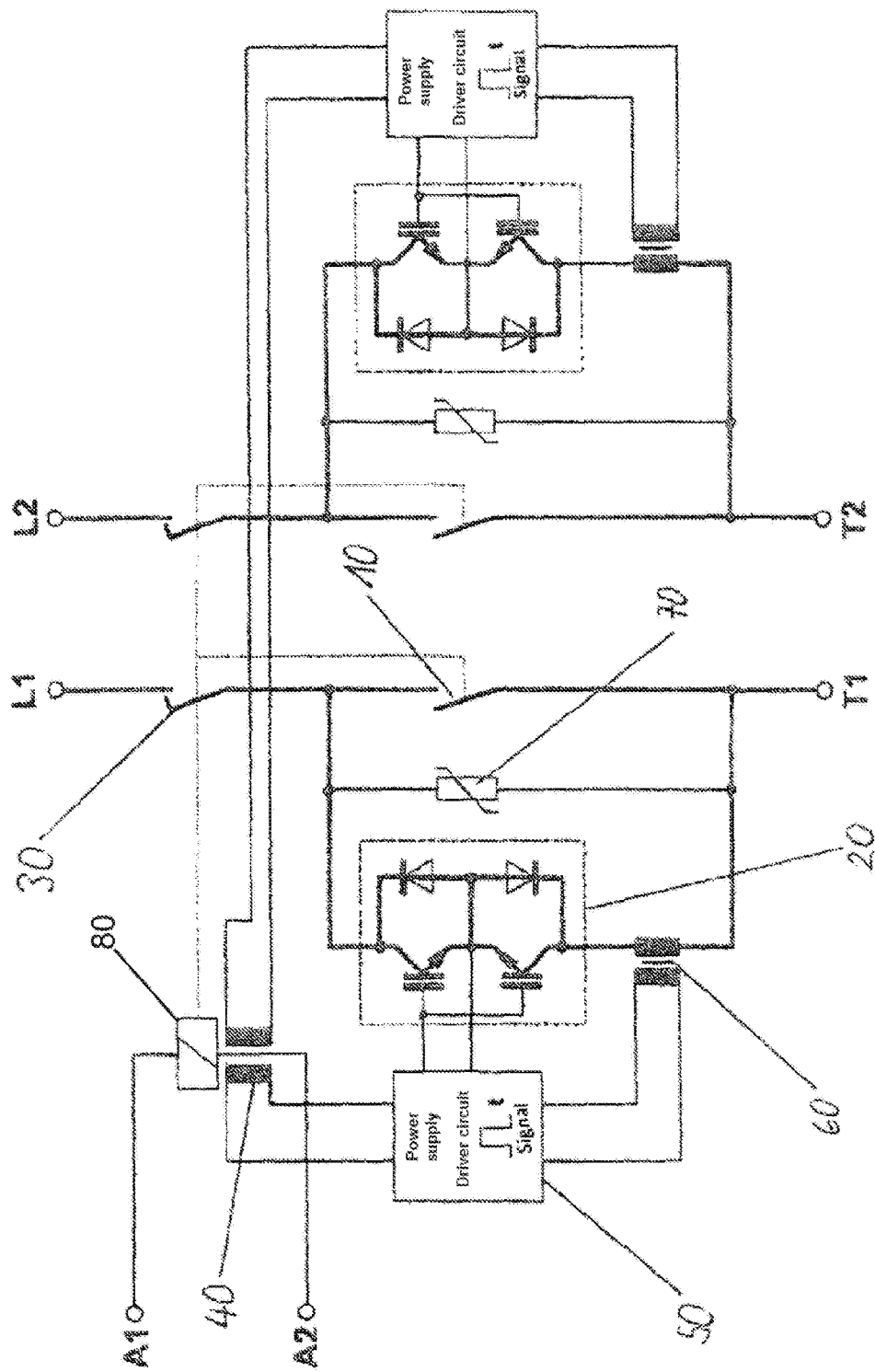
FIG. 1 is a block circuit diagram of an embodiment of a switching device comprising a dual contact assembly according to the invention.

An aspect of the present invention involves using two mechanical contact assemblies connected in series and a semiconductor switch connected in parallel with one of the mechanical contact assemblies in order to largely prevent the development of arcs when interrupting an electrical current and also to ensure reliable galvanic isolation, which in principle does not have semiconductor-based contact assemblies, by means of the second electromechanical contact assembly connected in series.

One embodiment of the invention relates to a switching device for conducting and interrupting electrical currents, comprising a first mechanical contact assembly, a semiconductor switch connected in parallel with the first mechanical contact assembly, a second mechanical contact assembly connected in series with the first mechanical contact assembly, an auxiliary coil which is galvanically isolated from the circuit of a contact module for moving contacts of the first and second mechanical contact assembly and is electromagnetically coupled to a coil of the contact module such that a voltage is generated therein when the power supply to the contact module is shut off, and an electronic switching system which is designed to turn on and shut off the semiconductor switch and is supplied with the voltage that is generated in the auxiliary coil when the power supply to the contact module is shut off. Owing to the semiconductor switch connected in parallel with the first mechanical contact assembly, the duration of arcs developing during switching can be reduced. Furthermore, by galvanically isolating the power supply of the electronic switching system by means of the auxiliary coil, a high electric strength can be achieved if the auxiliary coil is accordingly designed, as a result of which the electronic switching system is particularly well protected against excessively high voltages.

The auxiliary coil may be wound around the coil of the contact module. As a result, particularly efficient electromagnetic coupling to the coil of the contact module can be achieved, meaning that a reliable power supply to the electronic switching system can be obtained.

The electronic switching system may be designed to turn on the semiconductor switch once it is being supplied with a voltage from the auxiliary coil. Since mechanically opening the switching contacts of the first mechanical contact assembly generally takes longer than providing the power supply to the electronic switching system by means of the auxiliary coil, the semiconductor switch may already be turned on before the switching contacts are opened, and therefore the electrical current to be switched can be commutated from the first mechanical contact assembly to the semiconductor switch largely without any arcs developing.

Furthermore, a current transformer may be provided for detecting the flow of current through the semiconductor switch and generating a corresponding signal which is conveyed to the electronic switching system, the electronic switching system being designed to shut off the semiconductor switch depending on the signal conveyed. This makes it possible to adapt the control of the semiconductor switch, in particular when said switch is shut off, to apparatus-specific fluctuations in the electrical current to be switched. In particular, shutting off the semiconductor switch can be better adapted to the actual flow of current.

For example, the electronic switching system may be designed to shut off the semiconductor switch once the signal has been received from the current transformer and after a predefined current flow time has elapsed. Therefore, once the current transformer indicates that a current is flowing through the turned-on semiconductor switch, the length of time for which this current flows can be limited by the electronic switching system so that the semiconductor switch is not loaded by the flow of current for too long. The predefined current flow time may be calculated such that after a switching arc occurring between the contacts of the opening second mechanical contact assembly is quenched, there is sufficient time for resolidifying the break gap in the series connection of the first and second mechanical contact assemblies.

The first and second mechanical contact assemblies may also be designed to be opened by the contact module in a time-delayed manner such that the second mechanical contact assembly is only opened after a defined length of time has elapsed after the first mechanical contact assembly has been opened. Because the contacts are opened in a delayed manner, an arc can be almost entirely prevented from developing when the contacts of the second mechanical contact assembly are opened if the current has already been brought to zero within the defined length of time by the semiconductor switch.

Another embodiment of the invention also relates to a switchgear comprising a switching device according to the invention and as described herein and a contact module for moving contacts of the first and second mechanical contact assembly. A switchgear of this type may in particular have a specially modified magnetic drive, in which an auxiliary coil of a switching device according to the invention is wound around the drive coil and supplies power to an electronic switching system, which actuates a hybrid switch of the switchgear.

Other advantages and possible uses of the present invention are found in the following description in conjunction with the embodiments shown in the drawings.

In the following description, like, functionally like and functionally associated elements may be provided with the same reference signs. Absolute values are only stated in the following by way of example and should not be understood to have a limiting effect on the invention.

FIG. 1 is the block circuit diagram of a switching device according to the invention for a dual-terminal, polarity-independent switchgear. The connections of the switchgear for the two terminals are denoted L1, T1 and L2, T2, respectively.

For each terminal, the switching device comprises a parallel connection of a first mechanical (quenching) contact assembly 10 to a semiconductor switch 20 on the basis of an anti-serial IGBT assembly, which is connected in series to a second mechanical contact assembly 30 for ensuring the galvanic isolation.

The semiconductor switch 20 is turned on or shut off, i.e. activated or disconnected, by an electronic switching system 50. The electronic switching system 50 is supplied with power stored in the (magnetic drive) coil of the contact module 80 or magnetic drive of the switchgear. For this purpose, an auxiliary coil 40 which is galvanically isolated from the circuit of the contact module 80 is provided and (as described in detail in the following) can generate a voltage to supply the electronic switching system 50 with power when the contact module 80 is shut off. The connections of the contact module 80 are denoted by A1 and A2 in FIG. 1.

Figure 2:
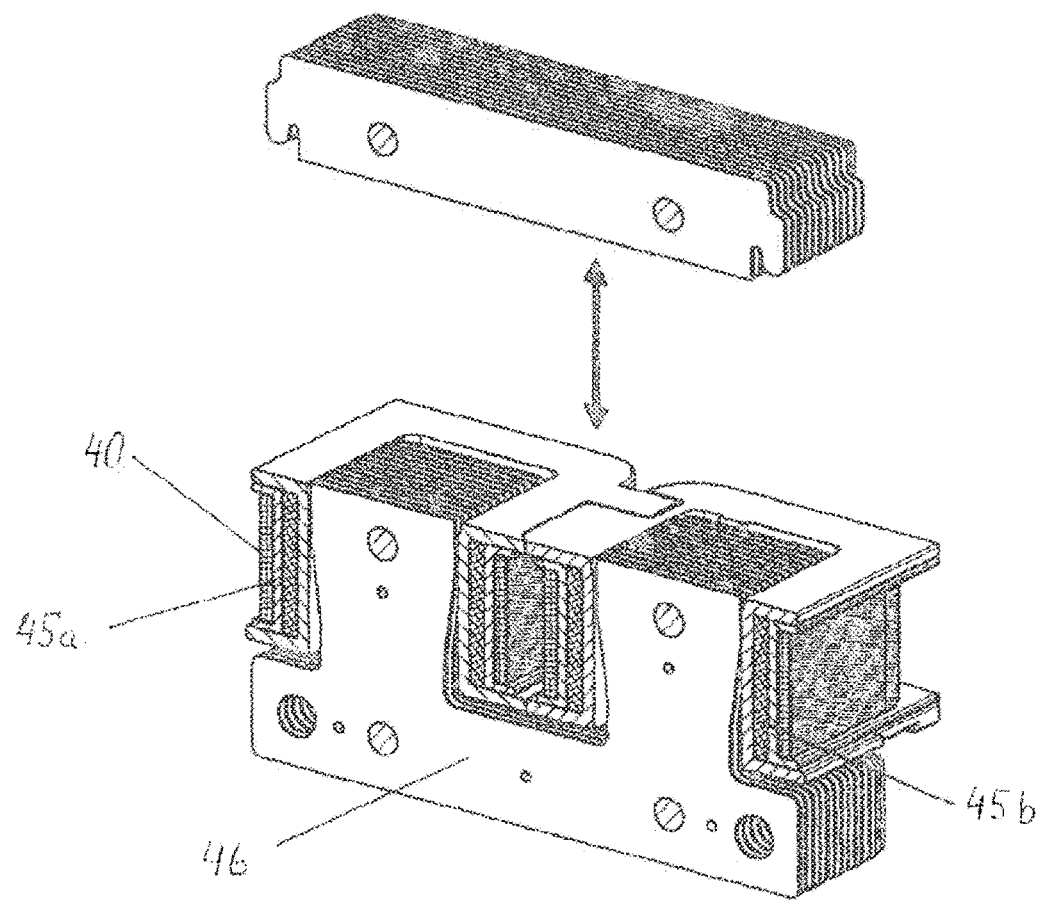
FIG. 2 shows an embodiment of a magnetic drive of a switchgear according to the invention.

The auxiliary coil 40 may for example be wound around the drive coil. FIG. 2 shows a magnetic drive modified in this way for a dual-terminal or multi-terminal switch (the drive shown per se is not limited to a certain number of terminals). In this figure, the drive coil is in the form of two half coils 45a, 45b connected in series, which each include a leg of the U-shaped magnetic core 46. A separate auxiliary coil 40 is wound around each of these half coils and is galvanically isolated from the respective drive coils. In this case, an auxiliary coil 40 either supplies power to the semiconductor switch 20 of one terminal in each case, or the two auxiliary coils 40 supply power to electronic switching system 50 of the two terminals in a redundant manner.

When switched on, i.e. when the contact module supplies the magnetic drive coil with a voltage and a current and the contacts of the first and second mechanical contact assemblies 10 and 30 are closed, the semiconductor switch 20 is disconnected, since in this state the auxiliary coil 40 does not generate a voltage for supplying power to the electronic switching system 50, and the electronic switching system 50 is therefore without voltage and the IGBTs of the semiconductor switch 20 cannot be activated.

At the point at which the supply of voltage and current to the magnetic drive coil of the contact module 80 for opening the contacts of the first and second mechanical contact assemblies 10 and 30 is shut off, the power stored in the magnetic drive coil generates a freewheel voltage, which in turn induces a voltage which activates the electronic switching system 50 in the auxiliary coil 40 which is electromagnetically coupled to the magnetic drive coil.

The voltage induced in the auxiliary coil 40 is sufficient both to supply power to the electronic switching system 50 and to build up the voltage required to actuate the IGBTs. The auxiliary coil 40 is advantageous in that the semiconductor switch can already be actuated before the contacts of the first and second mechanical contact assemblies 10 and 30 are opened.

In switchgears comprising an electromechanical magnetic drive, the period of time between initiating the shut-off process and opening the mechanical contacts is generally several milliseconds (ms), typically around 10 ms. During this time, the threshold voltage of the IGBTs (typically in the region of 7 V) has typically already been exceeded by the voltage induced in the auxiliary coil 40, and therefore the electronic switching system 50 can conduct said voltage to the IGBTs of the semiconductor switch 20, as a result of which the IGBTs are connected in a low-resistance manner (the semiconductor switch 20 is thus turned on) and the load current to be switched is immediately commutated to the semiconductor switch 20 as the (quenching) contacts of the first mechanical contact assembly 10 open.

By actuating the IGBTs in advance, an arc thus no longer develops between the opening quenching contacts of the mechanical contact assembly 10. During the low-resistance phase of the IGBTs of the semiconductor switch 20, i.e. as long as the electronic switching system 50 is being supplied with a sufficient operating voltage by the auxiliary coil 40, an arc may develop just for a short period of time between the opening (isolating) contacts of the second mechanical contact assembly 30; this can also be prevented if the isolating contacts of the second mechanical contact assembly 30 do not open at the same time as the quenching contacts of the first mechanical contact assembly 10, but rather the isolating contacts open after a defined time delay compared with the quenching contacts, and this can for example be brought about by a corresponding mechanical design of the two mechanical contact assemblies 10 and 30.

In terms of the highest possible electrical service life of the IGBTs and in terms of their acceptably large dimensions, it is expedient to limit the flow of current through the semiconductor switch 20 in terms of time such that the current only flows here until the mechanical break gap has sufficiently resolidified. In order to minimize the current flow time through the semiconductor switch 20, it is important to have precise knowledge of the point in time for the commutation, since the effective times for the mechanical shut-off process fluctuate for various reasons in every switchgear.

According to the present invention, the point in time for the commutation to the IGBT of the semiconductor switch 20 that has already been activated can be determined by a current transformer 60 positioned therein. The current transformer 60 generates a signal as soon as a current begins to flow through the IGBTs of the semiconductor switch 20, the flow of current thus commutating from the first mechanical contact assembly 10 to the semiconductor switch 20. The signal that is generated by the current transformer 60 and indicates the commutation is conveyed to the electronic switching system 50, which can then actuate the semiconductor switch 20 depending on said signal, as described in the following.

Immediately after commutation has taken place, the electronic switching system 50 can actuate the semiconductor switch 20 such that the IGBTs of the semiconductor switch 20 resume their blocking function after a current flow time that is short, defined by the electronic actuating system or predefined, and therefore the commutated load current in the semiconductor switch 20 is brought to zero within the defined length of time. In this case, the current flow time is calculated by the electronic switching system 50 such that, when a temporary switching arc develops at the isolating contacts, there is sufficient time for the break gap to resolidify after said arc is quenched. This is particularly important for high currents in air-break gaps. If vacuum switching chambers are used for the mechanical isolation, comparably short resolidification times can be obtained, and this is advantageous for minimizing the current flow time in the IGBTs.

By equipping the semiconductor switch 20 with an anti-serial IGBT, a switching assembly of this type can be used both for DC currents having any current-flow direction and for AC voltages having different frequencies, the switching time not being phase-angle dependent due to the actuating module being supplied with power separately.

During the shut-off process in the semiconductor switch 20, for high currents high dI/dt values occur, as a result of which voltage spikes of significantly greater than 1 kV may develop. In order to protect against such voltage spikes, it is expedient to connect a protective element, e.g. in the form of a varistor 70, either upstream of or in parallel with the semiconductor switch 20.

When the zero-current state is reached, the semiconductor switch 20 permanently assumes a blocking function. Reliable galvanic isolation is produced in the hybrid switch at the same time by the isolating contacts 30 that have opened in the meantime.

If, by means of a suitable mechanical or electronic coupling, it is ensured that the quenching contacts of the first mechanical contact assembly 20 are running ahead of the isolating contacts of the second mechanical contact assembly 30 by the amount of time in which the semiconductor switch 20 is conducting, it can be achieved that the two mechanical contact assemblies 10 and 30 switch almost completely without any arcs, and this is accordingly advantageous for the expected service life of the switching device and in particular of the hybrid switch.

The present invention is particularly suitable for use in contactors, power switches and protective motor switches which are designed in particular for operation with direct currents and/or low-frequency currents. The invention makes it possible to switch high direct currents and low-frequency currents while having a comparatively long electrical service life, since long arc times as well as a long period of current load on the semiconductor switch can be prevented. Furthermore, these properties make it possible to produce comparatively compact switchgears for high currents.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B, and C" should be interpreted as one or more of a group of elements consisting of A, B, and C, and should not be interpreted as requiring at least one of each of the listed elements A, B, and C, regardless of whether A, B, and C are related as categories or otherwise. Moreover, the recitation of "A, B, and/or C" or "at least one of A, B, or C" should be interpreted as including any singular entity from the listed elements, e.g., A, any subset from the listed elements, e.g., A and B, or the entire list of elements A, B, and C.

LIST OF REFERENCE SIGNS 10 first mechanical contact assembly
20 semiconductor switch
30 second mechanical contact assembly
40 galvanically isolated auxiliary coil
45a first half coil
45b second half coil
46 U-shaped magnetic core
50 electronic switching system
60 current transformer
70 varistor
80 contact module

The invention claimed is:

1. A switching device for conducting and interrupting electrical current, the device comprising:
   a first mechanical contact assembly;
   a semiconductor switch connected in parallel with the first mechanical contact assembly;
   a second mechanical contact assembly connected in series with the first mechanical contact assembly;
   an auxiliary coil which is galvanically isolated from a circuit of a contact module configured to move one or more contacts of the first and second mechanical contact assembly, the auxiliary coil being electromagnetically coupled to a coil of the contact module such that a voltage is generated therein when power supplied to the contact module is shut off;
   an electronic system which is supplied with the voltage that is generated in the auxiliary coil when power supplied to the contact module is shut off; and
   a current transformer configured to detect the flow of current through the semiconductor switch and generate a corresponding signal which is conveyed to the electronic switching system, the electronic switching system being configured to shut off the semiconductor switch depending on the signal conveyed.

2. The device of claim 1, wherein the auxiliary coil is wound around the coil of the contact module.

3. The device of claim 1, wherein the electronic switching system is configured to turn on the semiconductor switch once it is being supplied with the voltage from the auxiliary coil.

4. The device of claim 1, wherein the electronic switching system is configured to shut off the semiconductor switch once the signal has been received from the current transformer and after a predefined current flow time has elapsed, such that, once the current transformer indicates a current flow through the semiconductor switch in a turned-on condition thereof, the electronic switching system is configured to limit a time length of the current flow so as to limit a loading of the semiconductor switch.

5. The device of claim 1, wherein the first and second mechanical contact assemblies are configured to be opened by the contact module in a time-delayed manner such that the second mechanical contact assembly is only opened after the first mechanical contact assembly has been opened.

6. A switchgear, comprising:
   the device of claim 1; and
   the contact module.

7. The device of claim 2, wherein the electronic switching system is configured to turn on the semiconductor switch once it is being supplied with the voltage from the auxiliary coil.

8. The device of claim 3, wherein the electronic switching system is configured to shut off the semiconductor switch once the signal has been received from the current transformer and after a predefined current flow time has elapsed, such that, once the current transformer indicates a current flow through the turned-on semiconductor switch, the electronic switching system is configured to limit a time length of the current flow so as to limit a loading, of the semiconductor switch.

* * * * *